United States Patent [19]

Nepela et al.

[11] Patent Number: 5,717,550
[45] Date of Patent: Feb. 10, 1998

[54] ANTIFERROMAGNETIC EXCHANGE BIASING USING BUFFER LAYER

[75] Inventors: Daniel A. Nepela, San Jose; Marcos M. Lederman, San Francisco, both of Calif.

[73] Assignee: Read-Rite Corporation, Milpitas, Calif.

[21] Appl. No.: 742,473

[22] Filed: Nov. 1, 1996

[51] Int. Cl.[6] .................................................. G11B 5/39
[52] U.S. Cl. ........................................ 360/113; 360/126
[58] Field of Search ................................ 360/113, 126; 324/252; 338/32 R

[56] References Cited

U.S. PATENT DOCUMENTS

| | | | |
|---|---|---|---|
| 4,103,315 | 7/1978 | Hempstead et al. | 360/110 |
| 4,825,325 | 4/1989 | Howard | 360/113 |
| 5,287,237 | 2/1994 | Kitada et al. | 360/113 |
| 5,287,238 | 2/1994 | Baumgart et al. | 360/113 |
| 5,315,468 | 5/1994 | Lin et al. | 360/113 |
| 5,408,377 | 4/1995 | Gurney et al. | 360/113 |
| 5,422,571 | 6/1995 | Gurney et al. | 324/252 |
| 5,432,734 | 7/1995 | Kawano et al. | 360/113 |
| 5,436,778 | 7/1995 | Lin et al. | 360/113 |
| 5,442,508 | 8/1995 | Smith | 360/113 |
| 5,465,185 | 11/1995 | Heim et al. | 360/113 |
| 5,471,358 | 11/1995 | Tadokoro et al. | 360/113 |
| 5,515,221 | 5/1996 | Gill et al. | 360/113 |
| 5,552,949 | 9/1996 | Hashimoto et al. | 360/113 |
| 5,583,725 | 12/1996 | Coffey et al. | 360/113 |

*Primary Examiner*—Jefferson Evans
*Attorney, Agent, or Firm*—Nathan N. Kallman

[57] ABSTRACT

A thin film magnetic head employs antiferromagnetic and ferromagnetic layers in a layered structure to provide magnetic exchange field coupling. This structure is provided with a buffer layer which is in contact with either the ferromagnetic layer or the antiferromagnetic layer and whose action enhances the exchange field coupling between the antiferromagnetic and ferromagnetic layers and improves the corrosion resistance.

8 Claims, 4 Drawing Sheets

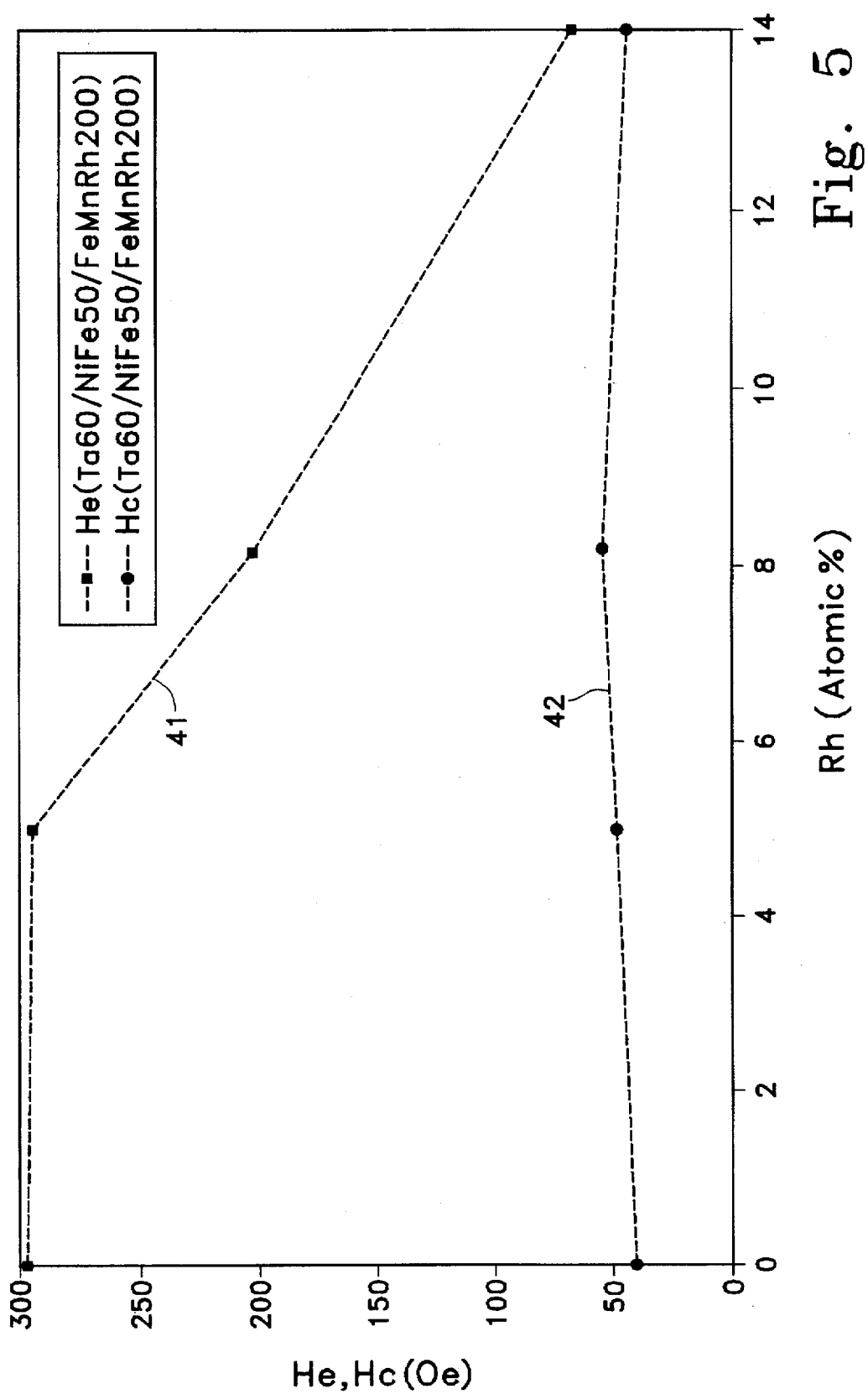

ANTIFERROMAGNETIC EXCHANGE BIASING USING BUFFER LAYER

FIELD OF THE INVENTION

This invention relates to thin film magnetic recording heads and in particular to such heads employing layers of antiferromagnetic material disposed in an exchange coupling relationship with layers of ferromagnetic material.

DESCRIPTION OF THE PRIOR ART

Thin film magnetic heads, particularly those involving magnetoresistive (MR) and spin-valve giant magnetoresistive (GMR) read structures employ multilayer arrangements of layers of antiferromagnetic (AFM) material alternating with layers of ferromagnetic material (FM) to produce magnetic exchange coupling between the adjacent layers. Such AFM/FM structures are used in establishing longitudinal bias in MR and GMR sensors and for magnetically pinning FM layers in spin valve devices. Examples of such an AFM/FM exchange coupled structure are shown in U.S. Pat. No. 4,103,315, Hempstead et al. The Hempstead et al reference states that for optimum operation, it is desirable to have the contact between the AFM and FM layers occur at the atomic level. The Hempstead et al. patent describes AFM materials including Mn gamma phase binary, ternary and higher alloys with elements selected from the group consisting of Fe, Co, Cu, Ge, Ni, Pt and Rh with Mn.

SUMMARY OF THE PRESENT INVENTION

In accordance with the invention, layered AFM/FM structures are provided with a buffer layer whose presence enhances the exchange coupling field He and the corrosion resistance of the AFM/FM structure. The structures of the present invention provide for exchange coupling fields which are high relative to the coercive field Hc.

BRIEF DESCRIPTION OF THE DRAWINGS

FIG. 5 are graphs showing variations in the exchange coupling field strength of a thin film structure of the present invention as a function of Rh content in the AFM film.

DESCRIPTION OF THE PREFERRED EMBODIMENT

Figure 1:
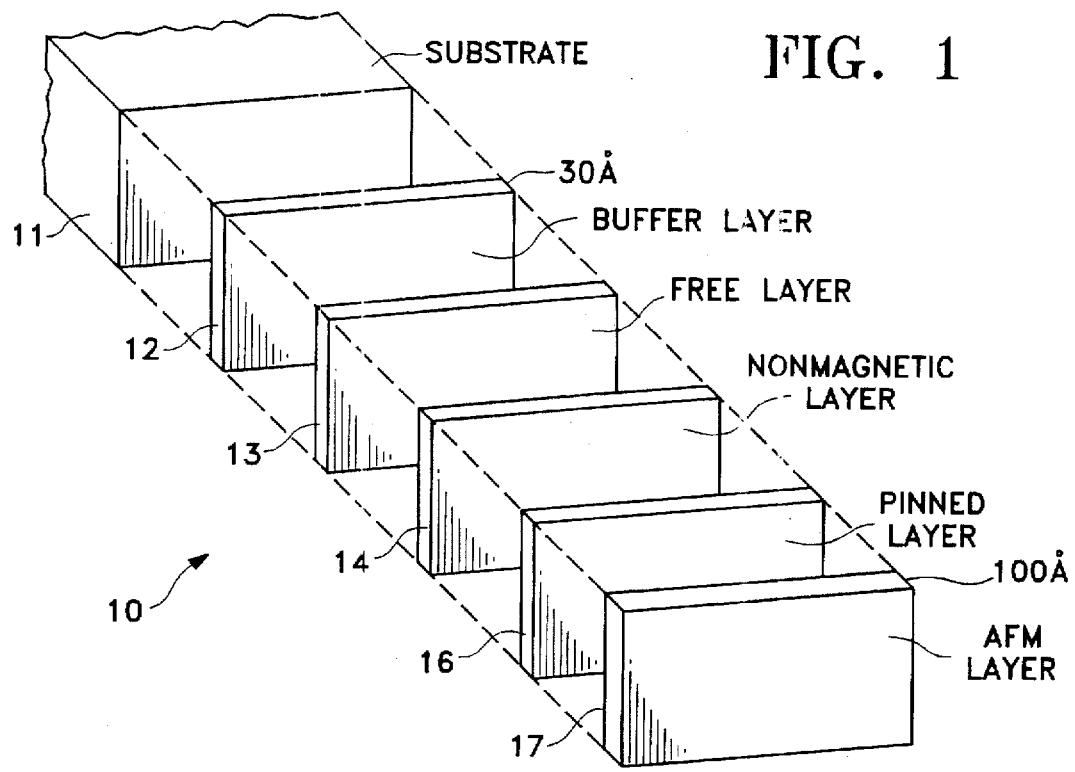
FIG. 1 is an isometric view of a portion of a thin film head embodying the present invention in a spin valve structure.

FIG. 1 shows in exploded isometric form one structure in accordance with the present invention for use in spin valve structures. Numeral 10 identifies a spin valve structure, which includes a substrate 11 on which is deposited a buffer layer 12. Buffer layer 12 is, for example, Ta, and preferably, although not necessarily, has a thickness of about 30 Å. Deposited on buffer layer 12 is a magnetically "free" layer 13 such as NiFe whose magnetization direction and magnitude vary as a function of a magnetic field which is to be sensed. Deposited on free layer 13 is an electrically conductive, nonmagnetic layer 14 such as Cu. A pinned magnetic layer 16 such as NiFe is deposited on nonmagnetic layer 14, and a pinning AFM layer 17 is placed on pinned layer 16.

As is well known in the spin valve art, layers 13, 16 and 17 operate through magnetic exchange coupling to fix or pin the direction of magnetization of pinned layer 16, while the direction and magnitude of magnetization of free layer 13 varies as a function of the magnitude of the magnetic field to be sensed. These variations are detected by sensing means (not shown) to provide an indication of the magnitude of the sensed field. The operation of the spin valve structure is enhanced by buffer layer 12 in accordance with this invention, as will be pointed out below.

Figure 2:
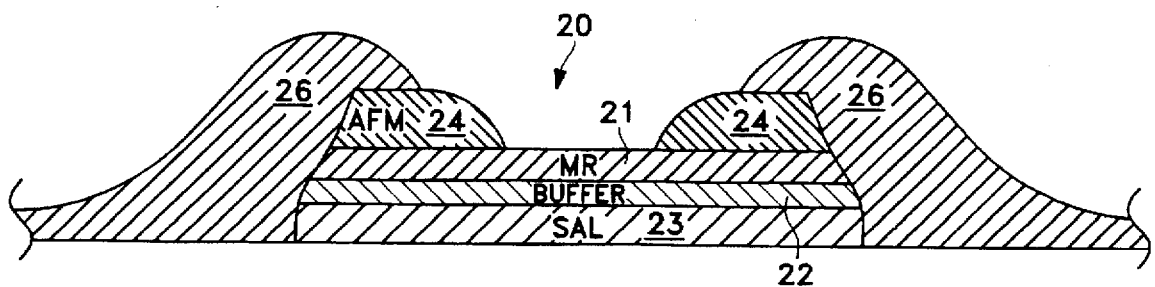
FIG. 2 is a cross-sectional side view of a thin film head utilizing the present invention to provide longitudinal bias to an MR sensor.

FIG. 2 illustrates an embodiment of the invention employed to generate longitudinal bias in thin film MR and GMR sensors. In FIG. 2, numeral 20 denotes a transducer which includes an MR sensor element 21 deposited on a buffer layer 22. Buffer layer 22 is made of Ta and is deposited on a soft adjacent layer (SAL) 23 made of NiFeRh, by way of example. SAL layer 23 is employed to provide longitudinal bias to the MR sensor to reduce or eliminate Barkhausen noise therein, as is well understood in the art. An AFM layer 24 is deposited on the ends of MR sensor element 21, leaving the active center region thereof free. Electrically conductive leads 26 are applied to AFM layer 24 to supply a sensing current to MR element 21 through AFM layer 24 and, if desired, to provide a transverse bias to MR element 21. In the embodiment of FIG. 2, Ta layer 22 acts as a buffer layer with the FM magnetoresistive layer 21 to increase the exchange coupling field He of AFM layer 24.

The preferred composition of the AFM layer in both embodiments is FeMnRhY, where Y is selected from Pt, Pd, Ti, Zr, Hf, Nb, Cr, Ni, Co, and Ir, and where Rh is from 3–8 atomic percent and Y is from 0–10 atomic percent, with the ratio of Fe to Mn ranging from 0.8 to 1.8:1.

Figure 3:
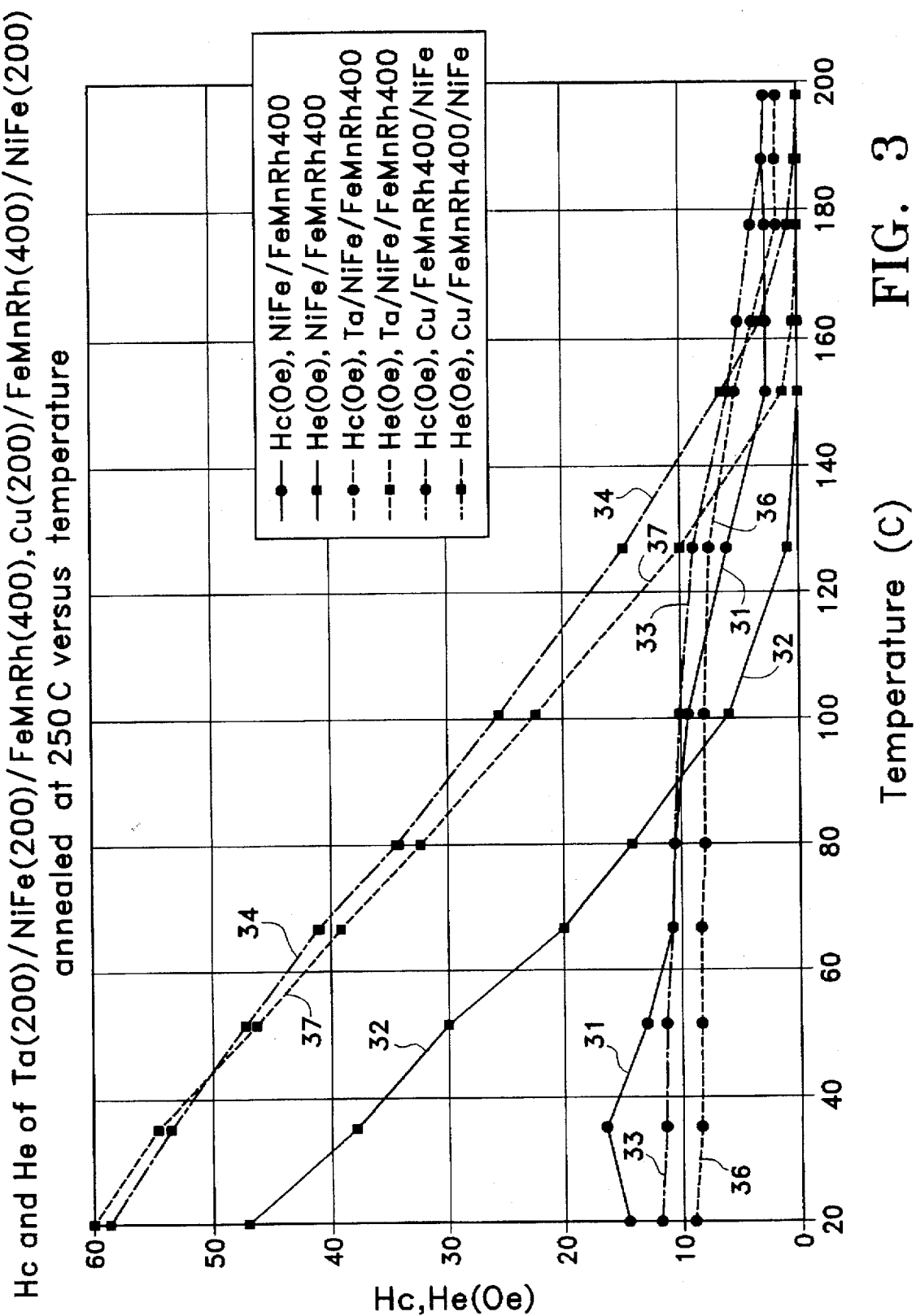
FIG. 3 are graphs showing the effects of the present invention on the exchange coupling fields in different AFM/FM compositions.

The graphs of FIG. 3 show variations in the exchange coupling field He and the field Hc as a function of temperature for different AFM/FM structures with and without a buffer layer. The AFM layers were $Fe_{49}Mn_{46}R_5$, specified in atomic %, and 400 Å thick. All films were deposited on a NiFe FM layer. In the present invention, the samples are preferably annealed at temperatures ranging from 175° to 250° C., and all of the samples represented in FIG. 3 were annealed at 250° C. Curve 31 of FIG. 3 shows the Hc values for a structure having an FM layer of NiFe and an AFM layer of FeMnRh of 400 Angstroms, with no buffer layer, and curve 32 shows the exchange coupling field He values for this same AFM/FM structure.

Curve 33 of FIG. 3 shows the variations in the value of Hc for an AFM/FM layered structure of FeMnRh/NiFe with a Ta buffer layer in accordance with this invention, while curve 34 illustrates the He field for this same structure. Curve 36 of FIG. 3 shows the variations in the value of Hc for a AFM/FM layered structure of FeMnRh/NiFe with a Cu underlayer. Curve 37 illustrates the variations in the values of He for this same structure.

From the graphs of FIG. 3, it can be seen that the compositions of the present invention produce substantially improved values of He over a range of operating temperatures for both Ta and Cu buffer layers in comparison to the values for the same AFM/FM composition without a buffer layer. FIG. 3 shows that with the buffer layers of this invention, the value of He is greater than Hc for temperatures up to 130°–140° C.

These improved performance characteristics are believed to result from the fact that the buffer layers of the present invention promote the growth of the gamma phase of FeMnRh through lattice matching. The Cu binary alloys, CuZn, CuSb, CuSn, CuGe and CuMn, are examples of Cu alloys capable of lattice matching to FeMnRh or FeMn. This promotes the formation of the desired gamma phase AFM alloy, thus providing larger exchange fields than would be obtained without such matching, and thereby optimizing the exchange field produced. In the case of these Cu-based binary alloys, the AFM layer may be deposited directly on the buffer layer.

Tantalum also promotes the formation of the desired gamma phase AFM alloy by the fact that it provides a strong fcc 111 texture of NiFe upon which the AFM material is deposited. This fcc 111 texture promotes the desired gamma phase growth of the AFM material.

Figure 4:
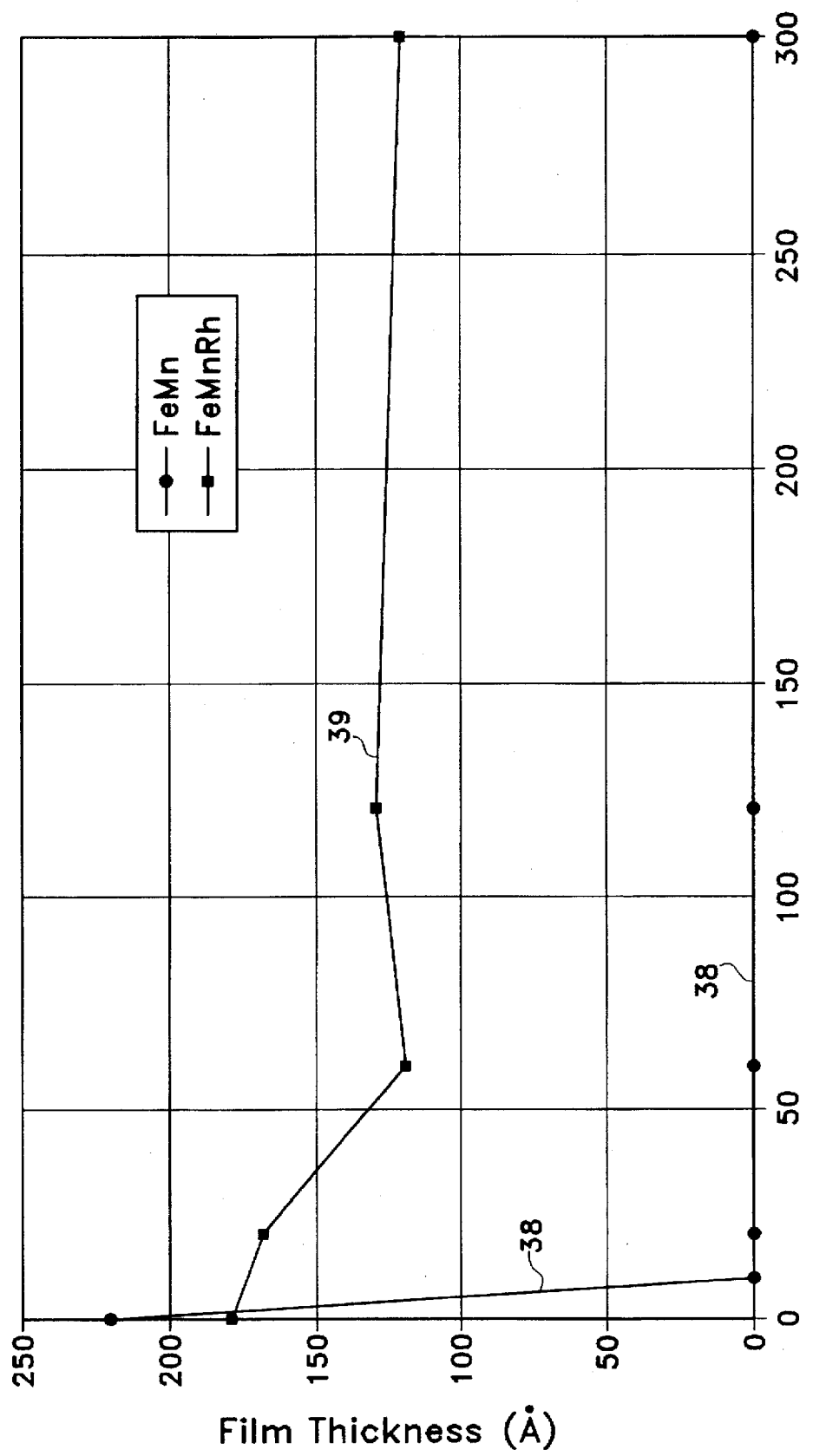
FIG. 4 are graphs illustrating the improved corrosion resistance measured against etch rate of an AFM film in a thin film member of the present invention.

The graphs of FIG. 4 show the improved corrosion resistance of a structure in accordance with this invention. Curve 38 shows the corrosion of an AFM layer of FeMn on a FM layer of NiFe with a buffer layer, while curve 39 illustrates the corrosion of an AFM layer of FeMnRh on a FM layer of NiFe with a buffer layer. The improved corrosion resistance resulting from the present invention provides for less complex or less sensitive processing steps as compared with those required for binary alloys of FeMn. For example, FeMn etches in 10 seconds in a 1% acidic solution of pH~3-0, whereas it takes in excess of 300 seconds to etch FeMnRh.

The graphs of FIG. 5 show variations in the He and Hc fields (curves 41 and 42, respectively), of a 200 Å AFM layer of FeMnRhx on a NiFe FM layer as a function of Rh concentration in the FeMnRhx layer, where x is the atomic % Rh. It can be seen that for Rh concentrations below 5 atomic % in the AFM layer, the value of the exchange coupling field He is high and constant, which is a desired result.

What is claimed is:

1. A magnetic thin film structure including:

a layer of a ferromagnetic material;

a layer of an antiferromagnetic material having a face centered cubic crystalline Structure in contact with said layer of ferromagnetic material;

a buffer layer in contact with either said layer of ferromagnetic material or said layer of antiferromagnetic material, in which Said layer of antiferromagnetic material comprises FeMnRhY, where Y is selected from the group including Pt,Pd,Ti,Zr,Hf,Nb,Cr,Ni,Co and Ir.

2. A magnetic thin film structure in accordance with claim 1 in which said Rh is present in said layer of antiferromagnetic material in a concentration of between 3–8 atomic percent.

3. A magnetic thin film structure in accordance with claim 1 in which said buffer layer comprises Ta, Cu or a lattice-matched alloy selected from the group including CuZn, CuSb, CuSn, CuGe and CuMn.

4. A magnetic thin film head in accordance with claim 3 in which said layer of antiferromagnetic layer is deposited on said buffer layer constituted of Cu and its alloys.

5. A magnetic thin film head in accordance with claim 3 in which said buffer layer is Ta and said ferromagnetic layer is deposited on said buffer layer and said antiferromagnetic layer is deposited on said ferromagnetic layer.

6. A thin film head in accordance with claim 1 in which said structure is annealed at a temperature in the range of 175° to 250° C.

7. A magnetic thin film head in accordance with claim 1 in which said buffer layer has a thickness of about 30 Angstroms.

8. A magnetic thin film structure as in claim 1, wherein the ratio in atomic percent of Fe to Mn ranges from 0.8 to 1.8:1.

* * * * *